(12) United States Patent
Lin et al.

(10) Patent No.: US 7,098,830 B2
(45) Date of Patent: Aug. 29, 2006

(54) CURRENT SWITCHING ARRANGEMENT FOR D.A.C. RECONSTRUCTION FILTERING

(75) Inventors: Heng-Chih Lin, Plano, TX (US);
Chien-Chung Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/821,576

(22) Filed: Apr. 9, 2004

(65) Prior Publication Data
US 2005/0225464 A1 Oct. 13, 2005

(51) Int. Cl.
*H03M 1/66* (2006.01)
*H03M 1/06* (2006.01)
*H04B 1/10* (2006.01)

(52) U.S. Cl. .................. 341/144; 341/118; 375/350

(58) Field of Classification Search ............. 341/118, 341/120, 136, 143, 144, 145, 141, 119; 375/350; 710/69; 327/355
See application file for complete search history.

(56) References Cited

U.S. PATENT DOCUMENTS

| | | | | |
|---|---|---|---|---|
| 5,521,946 A * | 5/1996 | Main | ........................ | 375/350 |
| 5,625,357 A * | 4/1997 | Cabler | ........................ | 341/143 |
| 5,625,360 A * | 4/1997 | Garrity et al. | ........................ | 341/144 |
| 5,880,689 A * | 3/1999 | Kushner | ........................ | 341/144 |
| 6,310,569 B1 * | 10/2001 | Chaudhry et al. | ........................ | 341/144 |
| 6,392,573 B1 * | 5/2002 | Volk | ........................ | 341/118 |
| 6,507,304 B1 * | 1/2003 | Lorenz | ........................ | 341/144 |
| 6,545,622 B1 * | 4/2003 | Kamal et al. | ........................ | 341/144 |
| 6,621,432 B1 * | 9/2003 | Ganci | ........................ | 341/136 |
| 6,639,534 B1 * | 10/2003 | Khoini-Poorfard et al. | . | 341/144 |
| 6,720,898 B1 * | 4/2004 | Ostrem | ........................ | 341/144 |
| 6,741,195 B1 * | 5/2004 | Cho | ........................ | 341/136 |
| 6,747,583 B1 * | 6/2004 | Tucholski et al. | ........................ | 341/118 |
| 6,768,438 B1 * | 7/2004 | Schofield et al. | ........................ | 341/144 |
| 6,809,673 B1 * | 10/2004 | Scanlan et al. | ........................ | 341/144 |
| 6,822,595 B1 * | 11/2004 | Robinson | ........................ | 341/144 |
| 6,833,801 B1 * | 12/2004 | Ostrem et al. | ........................ | 341/144 |
| 6,842,132 B1 * | 1/2005 | Schafferer | ........................ | 341/144 |
| 6,909,390 B1 * | 6/2005 | Khoini-Poorfard et al. | . | 341/144 |

(Continued)

FOREIGN PATENT DOCUMENTS

WO    WO 96/25793    * 8/1996

OTHER PUBLICATIONS

Jurgen et al, "Single-Side-Band Digital-to-Analog Converters for Nyquist Signal Generation," 2003, IEEE, pp. 93-96, no month.*

*Primary Examiner*—Patrick Wamsley
(74) *Attorney, Agent, or Firm*—Steven A. Shaw; W. James Brady; Frederick J. Telecky, Jr.

(57) ABSTRACT

An arrangement provides a reduced harmonic content output signal that represents a value of a digital input signal. The arrangement includes plural storage devices 301 . . . configured to sample and store the digital input signal at different respective phases of a clock signal. The arrangement also has plural current steering digital-to-analog converters (DACs) 311 . . . configured to receive respective stored digital signals from respective ones of the plural storage devices, and to provide respective currents that represent the received stored digital signals. The arrangement also includes a combining arrangement configured to combine the currents from respective ones of the plural current steering DACs, so as to provide the reduced harmonic content output signal that represents the value of the digital input signal.

18 Claims, 4 Drawing Sheets

U.S. PATENT DOCUMENTS 6,927,714 B1 * 8/2005 Teterwak ............... 341/136
6,967,609 B1 * 11/2005 Bicakci et al. ........... 341/144
6,977,602 B1 * 12/2005 Ostrem et al. ........... 341/145
6,992,608 B1 * 1/2006 Zhang et al. ............ 341/144
7,019,677 B1 * 3/2006 Soman et al. ........... 341/144

* cited by examiner

CURRENT SWITCHING ARRANGEMENT FOR D.A.C. RECONSTRUCTION FILTERING

BACKGROUND OF THE INVENTION

1. Field of the Invention

The invention generally relates to arrangements for suppressing or rejecting "images" (energy at harmonic frequencies) in communications systems. More particularly, the invention relates to arrangements that use a current switching technique to combine a digital-to-analog converter (DAC) function with a filtering function to significantly reduce harmonic images.

2. Related Art

FIG. 1 shows a conventional transmission arrangement, in which digital data are input to a digital-to-analog converter (DAC) 100. DAC 100 outputs an analog signal that changes value at discrete times determined by a clock signal CK as it clocks D-type flip-flops (not specifically shown) at the DAC's input. Being the result of discrete time clocking, the DAC's analog output signal has sharp vertical edges in the time domain.

Undesirably, the presence of sharp edges in the DAC's analog output signal implies there is significant energy at harmonic frequencies (see FIG. 5A; which assumes a CK frequency of 1 GHz). To mask interfering emissions such as those at harmonic frequencies (as effectively mandated, for example, by the U.S. Federal Communications Commission, FCC), a low pass reconstruction filter 102 has conventionally been employed. Such a filter lowers the higher-frequency content of signals before sending them to a modulator 104 for generating a radio frequency (RF) modulated signal.

The reconstruction filter is usually an analog filter that consumes a substantial amount of power, has large process/temperature/voltage variations (approximate ±30% for integrated passive R/C components), and is very difficult to design when the DAC input/output signal frequency is high. Furthermore, the closeness of the harmonic frequencies to the desire pass band, and the prevalence of higher energy content at lower harmonics (see FIG. 5A) have required filter 102 be complex.

Conventionally, higher order analog filters (such as Butterworth filters) have been used to implement filter 102. Undesirably, such complex filters are extremely difficult to design when the corner filter frequency is high. Also, operational amplifiers required in analog filters consume large amounts of power. Moreover, the unity gain bandwidth is often impossible to achieve with a high filter corner frequency. The accuracy of the corner frequency adjustment may sometimes be achieved by trimming or by calibration, but either of these approaches significantly increases design complexity.

Accordingly, there is a need in the art for an arrangement that simply and efficiently converts digital signals into analog signals that are lower in harmonic content, thereby avoiding or minimizing the need for the costly filters found in conventional systems.

SUMMARY

An arrangement provides a reduced harmonic content output signal that represents a value of a digital input signal. The arrangement includes plural storage devices configured to sample and store the digital input signal at different respective phases of a clock signal. The arrangement also has plural current steering digital-to-analog converters (DACs) configured to receive respective stored digital signals from respective ones of the plural storage devices, and to provide respective currents that represent the received stored digital signals. The arrangement also includes a combining arrangement configured to combine the currents from respective ones of the plural current steering DACs, so as to provide the reduced harmonic content output signal that represents the value of the digital input signal.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which.

DETAILED DESCRIPTION

Figure 1:
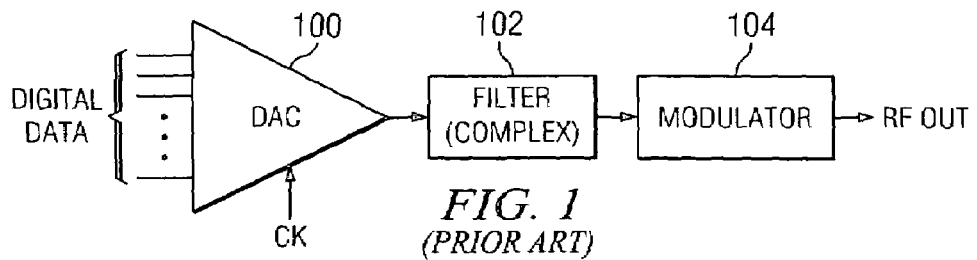
FIG. 1 shows a conventional transmission arrangement in which a complex and expensive low pass filter 102 is required to reduce unwanted harmonic "images" (reflections of the baseband spectrum, mirrored at higher frequencies) present in an analog signal output from a digital-to-analog converter (DAC) 100.

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

Moreover, features and procedures whose implementations are well known to those skilled in the art are omitted for brevity. For example, the design, selection, and implementation of basic electronic circuit elements such as signal level shifters, converters, modulators, filters, buffers, drivers, logic elements such as flip-flops and inverters, current and voltage sources, transformers, diodes, bipolar transistors, metal oxide semiconductor field effect transistors (MOSFETs), delay elements, antennas, and the like, lie within the ability of those skilled in the art, and accordingly any detailed discussion thereof may be omitted.

As one example, it is known that many current mode devices, such as the so-called "current-steering DACs," operate by providing two output currents whose relative magnitudes are determined by the input(s) to the device: specifically, if an input to a current-steering DAC is 00, then a first output might provide no current and the second output would provide all of the current; if the input is 01, then the first output would provide one-third of the total current and the second output would provide two-thirds of the total current; if the input is 10, then the first output would provide two-thirds of the total current and the second output would provide one-third of the total current; and if the input is 11, the first output would provide all of the current and the second output would provide no current.

As used herein, the terms "current mode" and "current domain" mean that the signals that represent the quantity that is to be communicated (generally meaning a baseband input signal) are linearly related to the quantity as electric currents, as distinguished from electric voltages. The various terms that are used in this specification are to be given their broadest reasonable interpretation when used in interpreting the claims.

Briefly, the embodiment disclosed herein uses a current switch filtering technique to implement a discrete time reconstruction filter in a current steering digital-to-analog converter (DAC). It takes advantage of current domain outputs of a current steering DAC, using multiple clock phases to "steer" (phase-adjust) and sum the currents in the resulting output. A result is discrete-time current-switched filter with a very accurate corner frequency.

Figure 2:
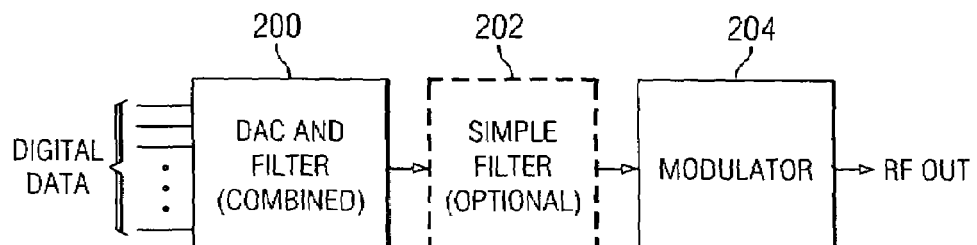
FIG. 2 shows a high-level schematic block diagram of one embodiment, in which a combined DAC/filter 200 simply and efficiently reduces the unwanted harmonic images.

FIG. 2 shows a high-level schematic block diagram of one embodiment, in which a combined DAC/filter 200 simply and efficiently reduces the unwanted harmonic images that are present in the output of a conventional DAC 100 (FIG. 1). The DAC/filter 200 receives digital data and provides an analog signal output to a modulator 204, either directly or through an optional filter 202. Thus, advantageously, the DAC filter may avoid the need for an intervening filter such as a low pass filter (LPF). Also, the overall transmitter may make use of a device low pass filter function that may be inherent in the modulator. Even if a filter 202 is present, it may be of a much simpler design than the complex filter 102 (FIG. 1) that is required at the output of a conventional DAC 100.

Figure 3A:
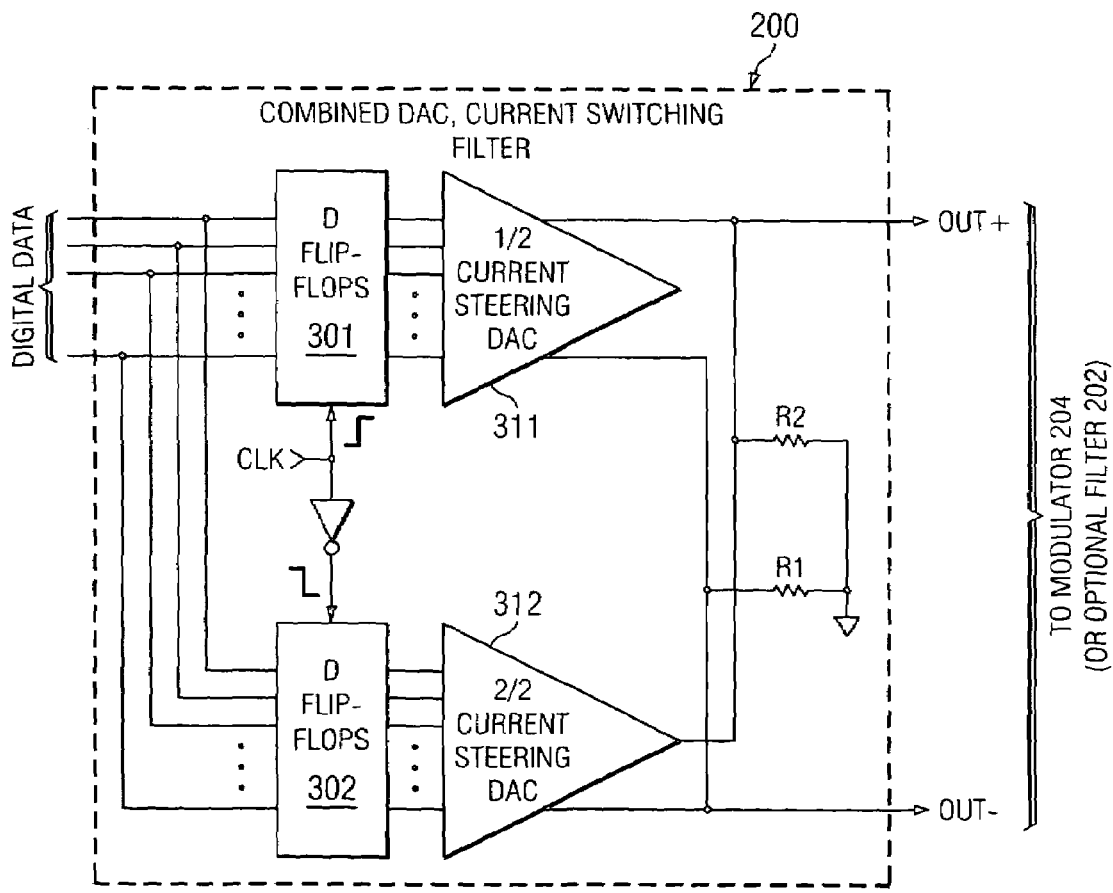
FIG. 3A illustrates one implementation of DAC/filter 200 from FIG. 2, an implementation involving N=2 current steering DACs.

FIG. 3A illustrates one implementation of DAC/filter 200 (FIG. 2). Digital data of an arbitrary number of bits is input to each of two D-type flip-flops (DFFs) 301, 302. In the illustrative embodiment involving interpolation of only two phases, the DFFs are clocked by opposite edges of a clock signal CLK. Here, "opposite" denotes 1800 relative phase offset. The clock signal has a frequency of one full cycle per bit period of the digital data signal, so that the two DFFs sample-and-hold the digital data on alternating edges of clock signal CLK.

DFFs 301, 302 provide clocked digital output signals to respective current steering DACs 311, 312. Each of the two DACs may be, for example, half the size of a single DAC having the desired output differential current level. That is, differential current from each DAC 311, 312 may be, for example, half of the desired total differential DAC current.

The current steering DACs 311, 312 have positive and negative outputs OUT+, OUT−. The DAC outputs constitute currents in the current domain. Accordingly, adding the quantities represented by the signals is achieved by summing outputs of the two DACs. More specifically, the OUT+outputs of DACs 311 and 312 are tied together, and the OUT− outputs of DACs 311 and 312 are tied together. By thus tying the corresponding outputs of the DACs together, the currents output by the DACs are added together to form the overall OUT+ and OUT− output signals that are provided to modulator 204 (FIG. 2), perhaps via an optional filter 202.

Output lines OUT− and OUT+ are connected to ground through respective resistors R1 and R2. R1 and R2 provide a current to voltage conversion and are chosen to provide the appropriate voltage signal swing at the differential current output.

In one embodiment, the current steering DACs are not clocked. That is, the current steering DACs respond to the stored digital signals and provide resulting outputs essentially continually, even in periods between transitions of clock CLK. In this manner, the current steering DAC outputs respond essentially immediately to changes in the DFF outputs, regardless of which clock phase is clocking the DFFs. This continual tracking of the discrete-time changes in the DFF outputs allows OUT+ and OUT− to closely track the input signal.

This close tracking provides an advantage that gains value as N, the number of DACs (and the number of clock phases that cause the DFFs to store new data), increases. In the simple example illustrated in FIG. 3A, a two-phase clock causes one or the other of two DFFs to send new data to a DAC every 360/2°=180° (in clock phase). Each DAC provides ½ (half) the desired total current.

Figure 3B:
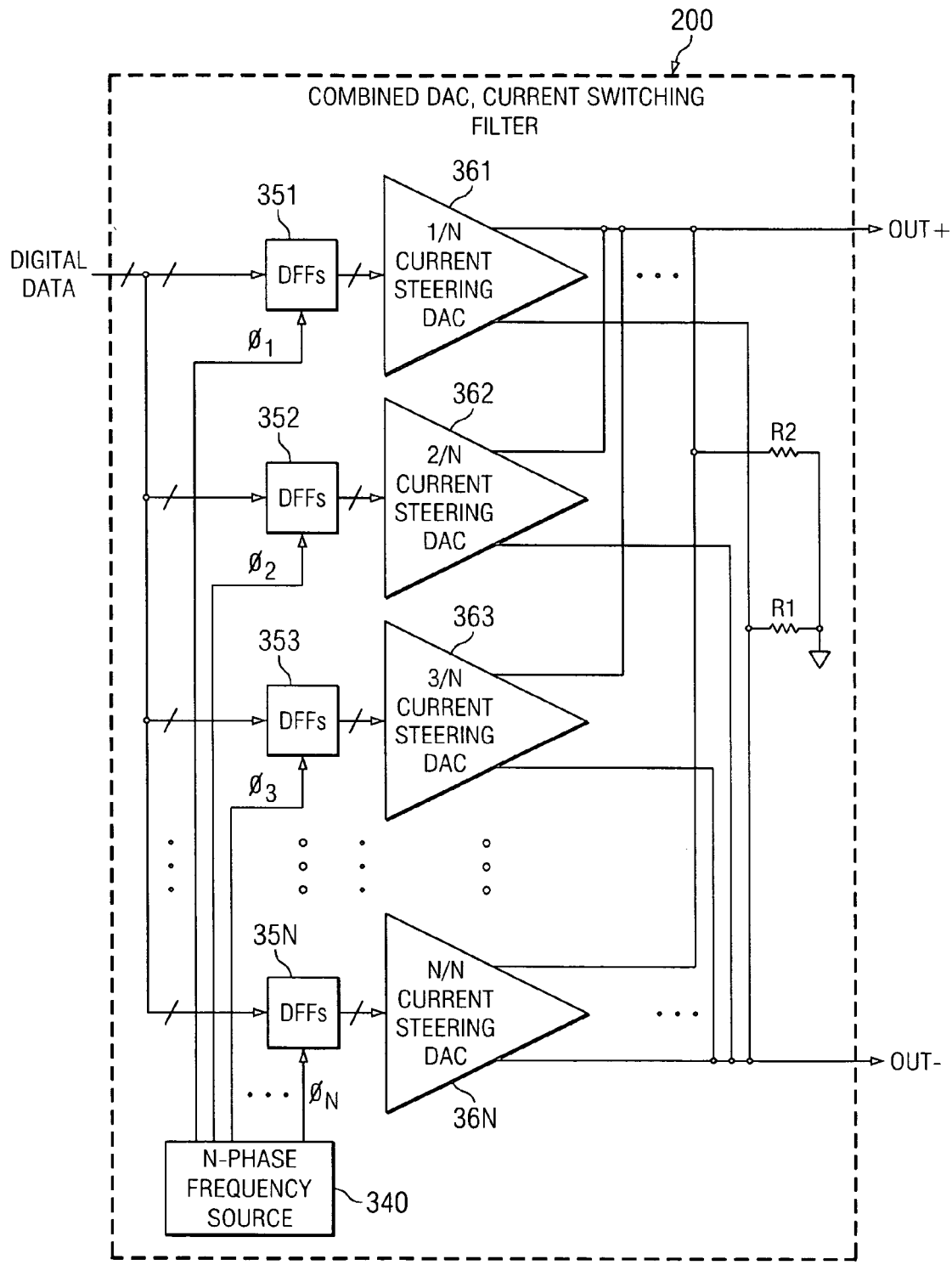
FIG. 3B illustrates an approach to implementing DAC/filter 200 involving a general case of N current steering DACs that possibly have mutually different weighting.

Speaking more generally and with reference to FIG. 3B, an N-phase clock causes one of N DFF arrays to send new data to a corresponding weighted DAC every 360/N°. As N increases, the summed values of the current steering DACs' N output signals more closely track the input signal, thus effectively rejecting more harmonic energy. In this general case, N DACs are present, each one of which needs to provide only a weighted fraction of the total desired output current. The optimized weighting associated with each DAC is different with different applications, and can be readily derived by those skilled in the art using well known discrete time filter theory.

Figure 3C:
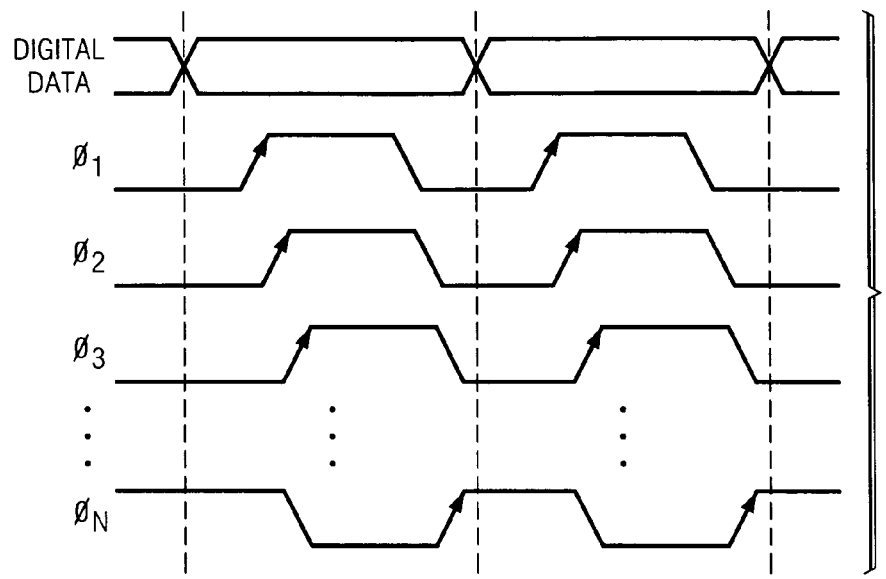
FIG. 3C is a timing diagram illustrating progressive phasing of N clock signals that may be used in the approach of FIG. 3B.

FIG. 3B illustrates an approach to implementing DAC/filter 200 involving a general case of N current steering DACs. Digital data are input to N sets of D-type flip-flops (DFFs), labeled 351, 352, 353 . . . 35N. DFFs 351, 352, 353 . . . 35N are clocked by respective clock signals $\phi_1$, $\phi_2$, $\phi_3$, . . . $\phi_N$, that are provided by a suitable N-phase frequency source 340. In one embodiment illustrated in the timing diagram of FIG. 3C, the N phased clock signals are equally spaced apart in phase, and are clocked on the rising edge of the clock signals.

The clocked DFFs 351, 352, 353 . . . 35N provide digital outputs to respective current steering DACs 361, 362, 363 . . . 36N. In FIG. 3B, the abbreviations "1/N", "2/N" and so forth, merely denote index numbers "1 of N", "2 of A1", and so forth, respectively; such labels do not imply that the DACs have to be identical, as they may have mutually different weightings. The DAC outputs constitute currents in the current domain. Accordingly, adding the quantities represented by the signals is achieved by summing outputs of the two DACs. The positive outputs of the current steering DACs are connected to sum currents to form signal OUT+. Likewise, the negative outputs of the current steering DACs are connected to sum currents to form signal OUT−.

Similar to FIG. 3A, output lines OUT− and OUT+ are connected to ground through respective resistors R1 and R2. R1 and R2 provide a current to voltage conversion and are chosen to provide the appropriate voltage signal swing at the differential current output.

Thus, FIG. 3B constitutes a generalization of the embodiment shown in FIG. 3A. With increasing values of N, closer approximations to sinusoidal waves can be generated at differential current outputs OUT+ and OUT−; accordingly, harmonic energy is suppressed through designs involving greater values of N.

Figure 4:
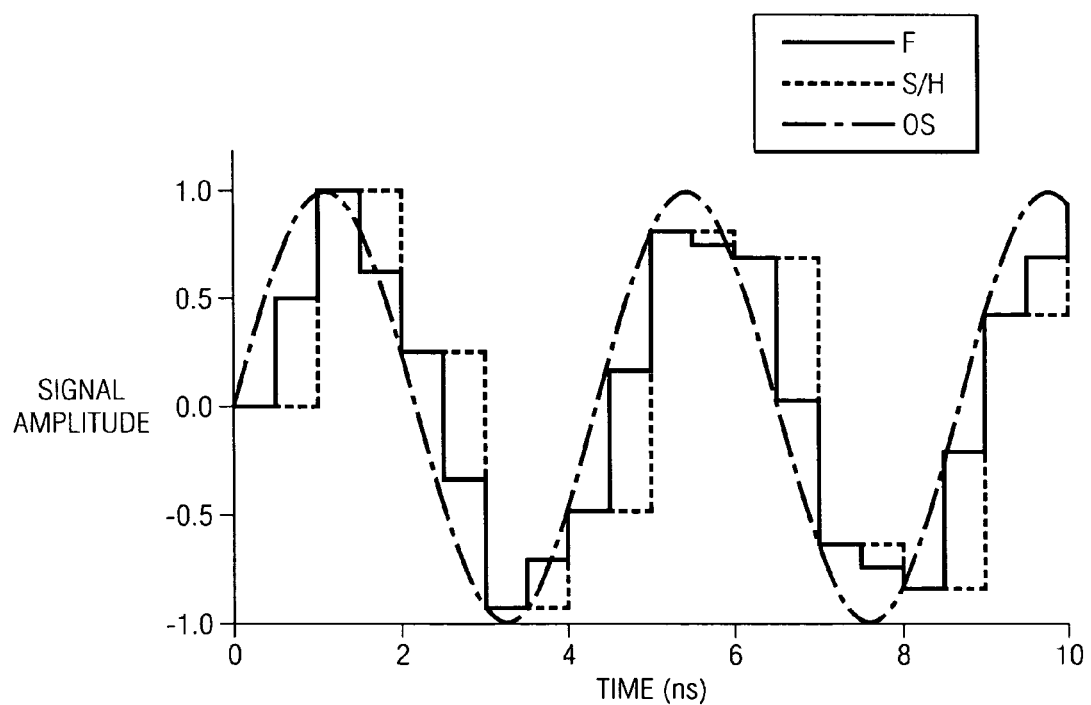
FIG. 4 shows time domain waveform illustrating the current interpolation properties of the combined DAC/filter 200 (FIGS. 2, 3A)

FIG. 4 shows time domain waveform illustrating the current interpolation properties of the combined DAC/filter 200 (FIGS. 2, 3A). FIG. 4 shows a simple illustrative example of a DAC/filter output signal F, one involving interpolation of only two phases. It is recognized that the illustrated concept may be expanded to interpolating more than two phases.

First, an analog input signal labelled "OS" (for "original signal") is illustrated. The input signal may be sinusoidal, as a pertinent example.

Also illustrated in FIG. 4 is a dotted-line signal labeled S/H (for "sample-and-hold") that might be observed at the output of a conventional DAC 100 (FIG. 1). The S/H signal changes in value once per nanosecond, in keeping with a 1 GHz clock frequency. The S/H signal does not closely approximate the input sinusoidal signal, resulting in significant energy at harmonic frequencies 1 GHz, 2 GHz, 3 GHz, 4 GHz, and so forth, shown in FIG. 5A, where the input signal bandwidth is assumed to be ±230 MHz. This unwanted energy causes interference, or violates the FCC mask once the baseband signal is modulated to the RF frequency.

The embodiment of FIG. 3A provides an output signal that is labeled F (for "filtered") in FIG. 4. Signal F constitutes a measure of the differential current between OUT+ and OUT− (FIG. 3A). In distinct contrast to the dotted-line S/H signal, the solid-line signal labeled F ("filtered") much more closely approximates the original signal OS, at least in part because F can change once every 0.5 nanoseconds rather than S/H's every 1.0 nanosecond. This shorter 0.5 nanosecond period is in keeping with the clocking of DFFs 301, 302 on opposite edges of a 1 GHz CLK signal (see FIG. 3A). By more closely approximating the original signal, the energy content of harmonic "images" is substantially reduced, as compared to the circuit shown in FIG. 1.

Figure 5A:
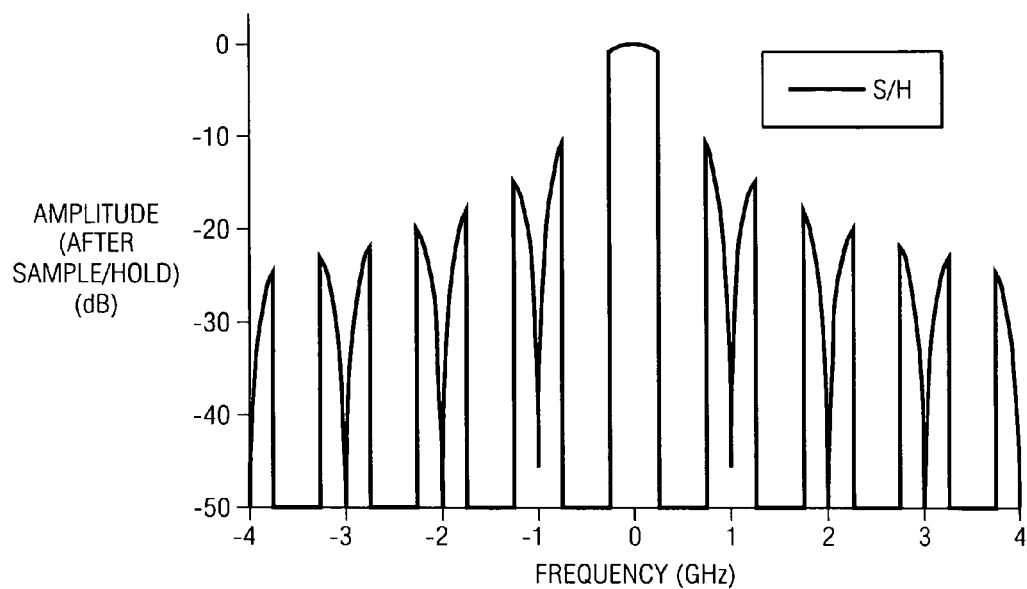
FIG. 5A shows a frequency domain diagram of energy (dB) in signals encountered after a sample-and-hold (S/H) element.
Figure 5B:
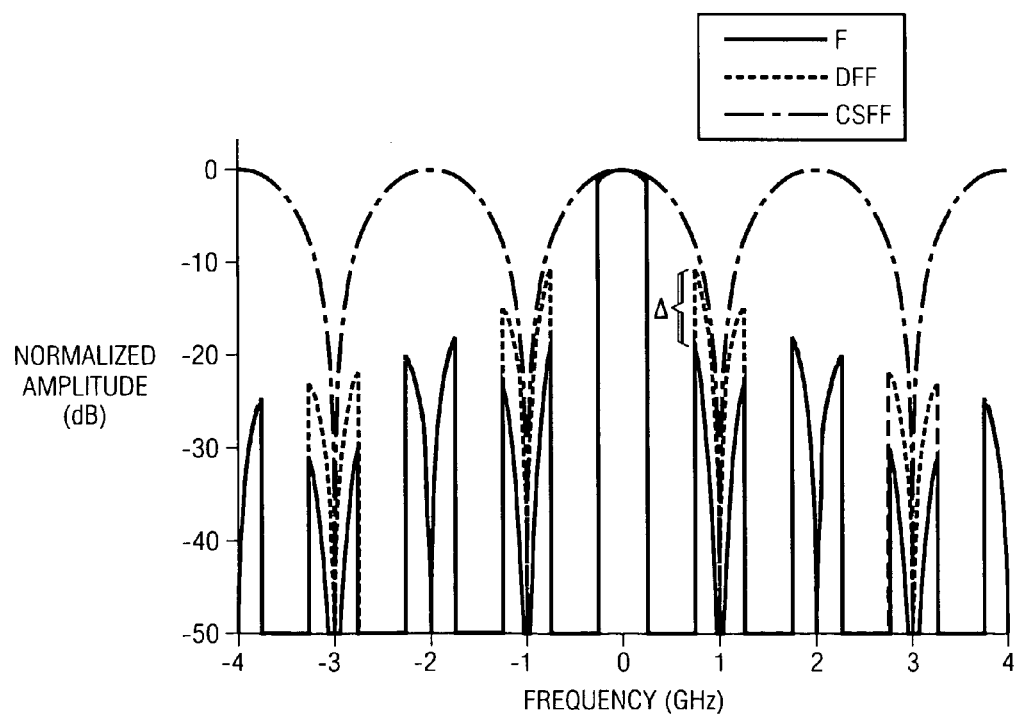
FIG. 5B illustrates the significant reduction in harmonic image energy provided by the embodiment of FIGS. 2, 3A.

FIG. 5A shows a frequency domain diagram of energy (dB) in signals encountered after a sample-and-hold (S/H) element in a conventional arrangement. For comparison, FIG. 5B illustrates the significant reduction in harmonic image energy (dB) provided by the embodiment of FIGS. 2, 3A. In the illustrated scenario, the conventional DAC of FIG. 1 and the two-phase interpolation current steering DAC of FIGS. 2, 3A are provided with a 230 MHz-bandwidth input signal. This bandwidth is about one-quarter of the 1 GHz separation between the baseband and the first "image," and between adjacent images. FIG. 5A shows the significant amount of energy in the "images" of the curve labeled S/H, which may be observed at the output of conventional DAC 100 (FIG. 1). It is desirable to pass the baseband signal but efficiently reject the images.

FIG. 5B shows a waveform DFF, indicating the spectrum of an analog representation of the (digital) outputs of DFFs 301, 302 (FIG. 3A). Waveform DFF (FIG. 5B) is for practical purposes identical to waveform S/H (FIG. 5A). In operation, the embodiment of FIGS. 2, 3A has a filtering function labeled CSFF (for "current steering filtering function"). Filtering the DFF signal by the current steering DACs implies that the DFF and CSFF curves are essentially multiplied, in the frequency domain. This multiplication results in waveform F.

As shown in FIG. 5B, waveform F results in a significant reduction in the odd-numbered images (1 GHz, 3 GHz, 5 GHz, and so forth). For example, the 1 GHz image is reduced by a difference value A that is greater than 8 dB for the 1GHz−230MHz=770MHz image that is closest to baseband. This degree of image rejection cannot readily be achieved by the conventional arrangement of FIG. 1, without a complex, sophisticated and costly filter 102.

Moreover, the simple current interpolation function can be easily implemented with very little overhead. FIG. 3A shows that two DACs (each of which may be half of the desired total size) are used, along with an extra set of DFFs. Thus, the only added overhead to achieving significant image rejection is the extra set of DFFs. The power consumption and chip area are almost the same as the conventional arrangement. Thus, the approach of FIGS. 2, 3A is accurate, requires very little power and area overhead, and reduces the sampled-and-hold images significantly. If necessary, the combined DAC/filter 200 can also be followed by a low-cost, simple analog filter having only passive components performing the filtering function (even a trivial RC filter) to further reject the images if necessary to meet particularly demanding requirements.

The illustrated discrete-time current switching filter is easy to implement. The corner frequency is accurate up to the accuracy of the multi-phase clocks (usually within 1-2%). Advantageously, the corner frequency does not change with semiconductor process, with temperature, or with supply voltage variation.

Thus, the described embodiments do not sacrifice simplicity, cost or power for improved performance. This approach can be readily extended to use N-phase clocks (N>2).

The present disclosure supports an arrangement for providing a reduced harmonic content output signal that represents a value of a digital input signal. The arrangement may include plural storage devices (301 ...) configured to sample and store the digital input signal at different respective phases of a clock signal; plural current steering digital-to-analog converters (DACs) (311 ...) configured to receive respective stored digital signals from respective ones of the plural storage devices, and to provide respective currents that represent the received stored digital signals; and a combining arrangement configured to combine the currents from respective ones of the plural current steering DACs, so as to provide the reduced harmonic content output signal that represents the value of the digital input signal.

There may be exactly two current steering DACs.

The plural storage devices may store the digital input signal at two phases of the clock signal that are substantially 180° apart.

The plural storage devices may store the digital input signal at N phases of the clock signal, where N may be greater than 2.

The N phases of the clock signal may be substantially equally spaced apart in phase, at substantially $(360/N)°$ apart.

There may be exactly N current steering DACs.

The current steering DACs may be configured to received the stored digital signal from the plural storage devices substantially continually, including periods between the phases of the clock signal at which the plural storage devices store the digital input signal.

The combining arrangement may include a set of electrical connections joining corresponding current outputs of the plural current steering DACs.

The plural current steering DACs and the combining arrangement may collectively perform a low pass filtering function that causes the reduced harmonic content output signal to more closely approximate a sinusoidal signal.

The arrangement may further include a low pass filter consisting essentially of passive components.

The arrangement may further include a low pass filter consisting essentially of resistive and capacitive components.

The combining element may pass the reduced harmonic content output signal to a modulator without any intervening low pass filter.

The present disclosure also supports transmission systems including the arrangements described herein.

The present disclosure further supports a method for providing a reduced harmonic content output signal that represents a value of a digital input signal. The method may involve sampling and storing the digital input signal at plural respective phases of a clock signal; receiving respective stored digital signals stored in the storing step, and providing respective currents that represent the received stored digital signals; and combining the currents so as to provide the reduced harmonic content output signal that represents the value of the digital input signal.

The sampling and storing step may involve sampling and storing the digital input signal at N clock signal phases that are substantially evenly distributed in phase.

N may be greater than 2.

The present disclosure further supports circuits configured to perform the methods described herein, or the methods performed by the arrangements described herein.

The foregoing embodiments are merely examples and are not to be construed as limiting the invention. The description of the embodiments is intended to be illustrative, and not to limit the scope of the claims. Numerous modifications and variations of the present invention are possible in light of the above teachings. For example, the choice of the quantity of current steering DACs and clocking phases lies within the contemplation of the present invention. Likewise, the manner in which signals are combined to form an "interpolated" or "filtered" signal that more closely emulates an input signal, may be varied while remaining within the scope of the invention. Of course, the particular hardware implementation may be varied while still remaining within the scope of the present invention. It is therefore to be understood that within the scope of the appended claims and their equivalents, the invention may be practiced otherwise than as specifically described herein.

The invention claimed is:

1. An arrangement for providing a reduced harmonic content output signal that represents a value of a digital input signal, the arrangement comprising:
   plural storage devices configured to sample and store the digital input signal at different respective phases of a clock signal;
   plural current steering digital-to-analog converters (DACs) configured to receive respective stored digital signals from respective ones of the plural storage devices, and to provide respective currents that represent the received stored digital signals; and
   a combining arrangement configured to combine the currents from respective ones of the plural current steering DACs, so as to provide the reduced harmonic content output signal that represents the value of the digital input signal.

2. The arrangement of claim 1, wherein:
   the plural storage devices store the digital input signal at N phases of the clock signal; and N>2.

3. The arrangement of claim 2, wherein:
   the N phases of the clock signal are substantially equally spaced apart in phase, at substantially $(360/N)°$ apart.

4. The arrangement of claim 3, wherein:
   there are exactly N current steering DACs.

5. The arrangement of claim 2, wherein:
   there are exactly N current steering DACs.

6. A transmission system including the arrangement of claim 2.

7. The arrangement of claim 1, wherein:
   there are exactly two current steering DACs.

8. The arrangement of claim 7, wherein:
   the plural storage devices store the digital input signal at two phases of the clock signal that are substantially 180° apart.

9. A transmission system including the arrangement of claim 8.

10. The arrangement of claim 1, wherein:
    the current steering DACs are configured to received the stored digital signal from the plural storage devices substantially continually, including periods between the phases of the clock signal at which the plural storage devices store the digital input signal.

11. The arrangement of claim 1, wherein the combining arrangement includes:
    a set of electrical connections joining corresponding current outputs of the plural current steering DACs.

12. The arrangement of claim 1, wherein:
    the plural current steering DACs and the combining arrangement are configured to perform a low pass filtering function that causes the reduced harmonic content output signal to more closely approximate a sinusoidal signal.

13. The arrangement of claim 1, wherein:
    the combining arrangement passes the reduced harmonic content output signal to a modulator without any intervening low pass filter.

14. A transmission system including the arrangement of claim 1.

15. A method for providing a reduced harmonic content output signal that represents a value of a digital input signal, the method comprising:
    sampling and storing the digital input signal at plural respective phases of a clock signal;
    receiving respective stored digital signals stored in the storing step, and providing respective currents that represent the received stored digital signals; and
    combining the currents so as to provide the reduced harmonic content output signal that represents the value of the digital input signal.

16. The method of claim 15, wherein the sampling and storing step includes:
    sampling and storing the digital input signal at N clock signal phases that are substantially evenly distributed in phase.

17. The method of claim 16, wherein: N>2.

18. A circuit configured to perform the method of claim 15.

* * * * *